(12) United States Patent
Gao et al.

(10) Patent No.: US 12,119,640 B2
(45) Date of Patent: Oct. 15, 2024

(54) ESD PROTECTION CIRCUIT

(71) Applicant: HUAWEI TECHNOLOGIES CO., LTD., Shenzhen (CN)

(72) Inventors: Wei Gao, Shenzhen (CN); Hongquan Sun, Beijing (CN); Wangsheng Xie, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 139 days.

(21) Appl. No.: 17/831,763

(22) Filed: Jun. 3, 2022

(65) Prior Publication Data
US 2022/0294213 A1    Sep. 15, 2022

Related U.S. Application Data

(63) Continuation of application No. PCT/CN2019/123806, filed on Dec. 6, 2019.

(51) Int. Cl.
    *H02H 9/04*      (2006.01)
    *H01L 27/02*     (2006.01)

(52) U.S. Cl.
    CPC ......... *H02H 9/046* (2013.01); *H01L 27/0255* (2013.01); *H01L 27/0266* (2013.01)

(58) Field of Classification Search
CPC ............................ H01L 27/0285; H02H 9/046
USPC ............................................................. 361/56
See application file for complete search history.

(56) References Cited

U.S. PATENT DOCUMENTS

| | | | |
|---|---|---|---|
| 5,946,175 A | 8/1999 | Yu | |
| 5,978,192 A * | 11/1999 | Young | H02H 9/046 361/111 |
| 6,400,204 B1 * | 6/2002 | Davis | H01L 27/0255 361/91.1 |
| 6,433,985 B1 | 8/2002 | Voldman et al. | |
| 7,253,453 B2 | 8/2007 | Ker et al. | |
| 7,839,612 B1 * | 11/2010 | Chan | H01L 27/0285 361/56 |
| 8,315,024 B2 | 11/2012 | Russ et al. | |

(Continued)

FOREIGN PATENT DOCUMENTS

| | | |
|---|---|---|
| CN | 101741075 A | 6/2010 |
| CN | 103795026 A | 5/2014 |

(Continued)

OTHER PUBLICATIONS

Chinese Office Action issued in corresponding Chinese Application No. 201980102666.9, dated Jan. 20, 2023, pp. 1-7.

(Continued)

*Primary Examiner* — Dharti H Patel
(74) *Attorney, Agent, or Firm* — Hauptman Ham, LLP (57) ABSTRACT

An electrostatic discharge (ESD) protection circuit is provided to minimize ESD damage to an internal circuit in a CDM model. The ESD protection circuit includes two stages of discharging circuits that are coupled to an IO pin and the internal circuit, a first power clamp circuit, and a second power clamp circuit. The first power clamp circuit is electrically connected to a power rail and a ground rail to discharge a part of a current to the ground, and the second power clamp circuit is electrically connected to a second-stage discharging circuit and the ground rail, so that the other part of the current is discharged to the ground through the second power clamp circuit.

14 Claims, 8 Drawing Sheets

(56) References Cited

U.S. PATENT DOCUMENTS

| | | | |
|---|---|---|---|
| 8,482,888 B2 | 7/2013 | Tsai | |
| 9,013,845 B1* | 4/2015 | Karp | H02H 9/041 |
| | | | 361/91.1 |
| 9,368,485 B1* | 6/2016 | Chu | H01L 27/0255 |
| 10,389,111 B2 | 8/2019 | Ikeda | |
| 11,176,985 B1* | 11/2021 | Nam | G06F 11/3062 |
| 11,689,014 B2* | 6/2023 | Krishnamoorthy | H02H 9/02 |
| | | | 361/111 |
| 11,699,697 B2* | 7/2023 | Xu | H01L 27/0262 |
| | | | 361/56 |
| 2001/0024348 A1 | 9/2001 | May et al. | |
| 2007/0097581 A1 | 5/2007 | Khazhinsky et al. | |
| 2009/0323236 A1* | 12/2009 | Morishita | H01L 27/0251 |
| | | | 361/56 |
| 2010/0259857 A1* | 10/2010 | Mayerhofer | H01L 27/15 |
| | | | 257/E33.044 |
| 2012/0236444 A1* | 9/2012 | Srivastava | H03F 1/52 |
| | | | 361/56 |
| 2012/0236447 A1* | 9/2012 | Mack | H02H 9/046 |
| | | | 361/56 |
| 2012/0307407 A1* | 12/2012 | Uenishi | H01L 29/7394 |
| | | | 361/56 |
| 2013/0044396 A1 | 2/2013 | Tsai et al. | |
| 2015/0138679 A1* | 5/2015 | Venkatasubramanian | |
| | | | H02H 9/046 |
| | | | 361/56 |
| 2015/0155707 A1* | 6/2015 | Truong | H02H 9/046 |
| | | | 361/56 |
| 2015/0207312 A1* | 7/2015 | Wang | H02H 9/046 |
| | | | 361/56 |
| 2015/0270258 A1* | 9/2015 | Dabral | H02H 3/22 |
| | | | 361/56 |
| 2015/0311700 A1* | 10/2015 | Lee | H02H 9/04 |
| | | | 361/56 |
| 2015/0380397 A1* | 12/2015 | Dabral | H01L 27/0255 |
| | | | 361/56 |
| 2016/0268248 A1 | 9/2016 | Fan et al. | |
| 2017/0126003 A1* | 5/2017 | Henzler | H02H 9/046 |
| 2017/0302066 A1* | 10/2017 | Gao | H03K 5/08 |
| 2018/0012886 A1* | 1/2018 | Mozak | H01L 27/0281 |
| 2020/0395935 A1* | 12/2020 | Bergsma | H03K 17/08122 |
| 2021/0391703 A1* | 12/2021 | Dua | H02H 9/046 |
| 2022/0158447 A1* | 5/2022 | Uemura | H01L 27/0255 |
| 2022/0320856 A1* | 10/2022 | Sakai | H02H 9/046 |
| 2023/0148160 A1* | 5/2023 | Sivakumar | H02H 9/046 |
| | | | 361/56 |
| 2023/0352932 A1* | 11/2023 | Li | H01L 27/0255 |

FOREIGN PATENT DOCUMENTS

| | | |
|---|---|---|
| CN | 104283201 A | 1/2015 |
| CN | 107482004 A | 12/2017 |
| CN | 110021922 A | 7/2019 |
| CO | 106783806 A | 5/2017 |

OTHER PUBLICATIONS

Extended European Search Report issued in corresponding European Application No. 19955377.7, dated Oct. 25, 2022, pp. 1-6.
International Search Report issued in corresponding International Application No. PCT/CN2019/123806, mailed Aug. 25, 2020, pp. 1-9.

* cited by examiner

FIG. 1

PRIOR ART

ESD PROTECTION CIRCUIT

CROSS-REFERENCE TO RELATED APPLICATIONS

This application is a continuation of International Application No. PCT/CN2019/123806, filed on Dec. 6, 2019, the disclosure of which is hereby incorporated by reference in its entirety.

TECHNICAL FIELD

This disclosure relates to circuit technologies, and in particular, to an ESD protection circuit.

BACKGROUND

Electrostatic discharge (ESD) is a phenomenon that harmful currents are generated because an insulation medium becomes a conductor when positive and negative charges accumulate on an insulation medium and a voltage generated by the charges is higher than a breakdown voltage. An internal circuit of a chip is fragile. Therefore, input/output (IO) pins need ESD protection to discharge static electricity generated on the IO pins. The ESD may be classified into a human body model (HBM) and a charged device model (CDM) by a discharge damage manner. The HBM has a smaller current but lasts longer, and the CDM has a larger current but lasts shorter. Chips of a modern process, especially chips of a fin field-effect transistor (FinFET) process, are more susceptible to CDM damage.

Figure 1:
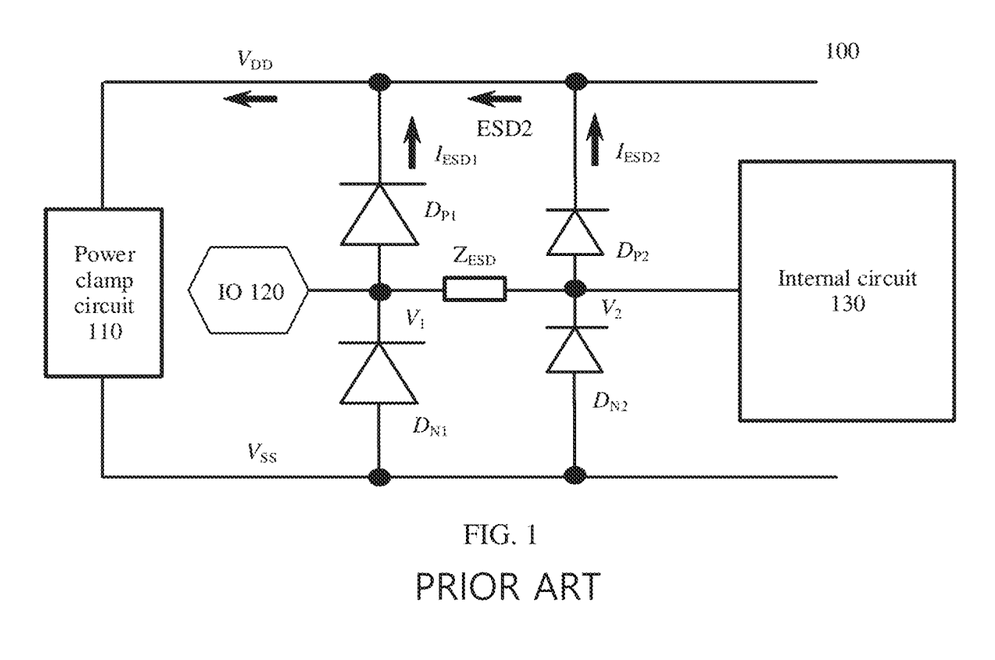
FIG. 1 shows an ESD protection circuit in a conventional technology.

FIG. 1 shows an ESD protection circuit 100 disposed between a power rail $V_{DD}$ and a ground rail $V_{SS}$. The ESD protection circuit 100 is configured to protect an internal circuit 130 of a chip. The CDM protection circuit 100 includes a power clamp circuit 110 directly coupled to the power rail $V_{DD}$ and the ground rail $V_{SS}$, two stages of discharging circuits that are disposed between an IO pin 120 and a protected circuit 130 and that are coupled to the power rail $V_{DD}$ and the ground rail $V_{SS}$, and an inter-stage impedance $Z_{ESD}$. The two stages of discharging circuits are coupled by using the inter-stage impedance $Z_{ESD}$. A first-stage discharging circuit of the two stages of discharging circuits includes two series-connected diodes $D_{P1}$ and $D_{N1}$ in a same direction. A second-stage discharging circuit includes two series-connected diodes $D_{P2}$ and $D_{N2}$ in a same direction. $D_{P1}$ and $D_{P2}$ share the same power rail, that is, a current $I_{ESD1}$ in the $D_{P1}$ and a current $I_{ESD2}$ in the $D_{P2}$ are discharged to the ground rail $V_{SS}$ through the same power clamp circuit 110. Because $I_{ESD1}$ and $I_{ESD2}$ share the power clamp circuit 110, when a large current is injected into the IO pin 120, an input node voltage of the protected circuit 130 is high. Therefore, the protected circuit 130 is still easily damaged.

SUMMARY

Embodiments of this disclosure provide an ESD protection circuit, to reduce damage caused by an electrostatic current generated by an IO pin of a chip to an internal circuit of the chip.

According to a first aspect, an embodiment of this disclosure provides an ESD protection circuit, including a first-stage discharging circuit, a first power clamp circuit, a second-stage discharging circuit, and a second power clamp circuit. The first-stage discharging circuit is electrically connected to an IO pin, a power rail, and a ground rail of a chip. The first power clamp circuit is electrically connected to the power rail and the ground rail. The second-stage discharging circuit is electrically connected to the second power clamp circuit, a protected circuit, and the ground rail. The second power clamp circuit is electrically connected to the second-stage discharging circuit and the ground rail. The ESD protection circuit divides a current generated by the IO pin into two parts. One part of the current flows into the power rail through the first-stage discharging circuit, and are then discharged to the ground rail through the first power clamp circuit. The other part of the current flows to the second power clamp circuit through the second-stage discharging circuit, and is then discharged to the ground rail through the second power clamp circuit.

With introduction of the second power clamp circuit, a current up to several amperes may be discharged to the ground rail $V_{SS}$ through two channels. This can reduce an input node voltage of the protected circuit when ESD occurs, and minimize ESD damage to the protected circuit. In addition, the introduction of the second power clamp circuit does not increase parasitic capacitance between the IO pin and the protected circuit. Therefore, the ESD protection circuit can minimize the ESD damage to the protected circuit without affecting a speed of the IO pin.

In a possible implementation, the ESD protection circuit further includes a bias resistor. A current input terminal of the second power clamp circuit is electrically connected to the second-stage discharging circuit and a first terminal of the bias resistor, a pull-down terminal of the second power clamp circuit is electrically connected to the ground rail, and a second terminal of the bias resistor is electrically connected to the power rail. The polarization resistor is used to isolate the second-stage discharging circuit from the power rail so that the first-stage discharging circuit and the second-stage discharging circuit do not share the same power rail.

In a possible implementation, the second power clamp circuit includes a first RC power clamp circuit, and a discharging transistor in the first RC power clamp circuit is an NMOS discharging transistor. An external terminal of a resistor of the first RC power clamp circuit is electrically connected to the power rail, a pull-down terminal of the first RC power clamp circuit is electrically connected to the ground rail, and a current input terminal of the first RC power clamp circuit is electrically connected to the second-stage discharging circuit. It is easy to understand that the external terminal of the resistor is an external terminal of a delay resistor of the first RC power clamp circuit, the pull-down terminal is a ground port, and the current input terminal is a port for receiving an electrostatic current. Using the RC power clamp circuit as the second power clamp circuit can better minimize ESD damage to the protected circuit.

In a possible implementation, the second power clamp circuit includes: a delay resistor and a delay capacitor that are connected in series, a first MOSFET and a second MOSFET that are connected by using a phase inverter, and a discharging transistor. A first terminal of the delay resistor is electrically connected to the power rail, a second terminal of the delay resistor is electrically connected to a first terminal of the delay capacitor at a first node, and a second terminal of the delay capacitor is electrically connected to the ground rail. A gate of the first MOSFET and a gate of the second MOSFET are both electrically connected to the first node. One of a source or a drain of the first MOSFET is electrically connected to the second-stage discharging circuit at a second node, and the other one of the source or the drain of the first MOSFET is electrically connected to one electrode of the second MOSFET at a third node. The other electrode of the second MOSFET is electrically connected to the ground rail. The first MOSFET and the second MOSFET are two complementary MOSFETs. A gate of the discharging transistor is electrically connected to the third node. One of a source or a drain of the discharging transistor is electrically connected to the second-stage discharging circuit at the second node, and the other one of the source or the drain of the discharging transistor is electrically connected to the ground rail. The first terminal of the delay resistor is electrically connected to the power rail. In this way, when the chip is powered on and operates normally, the second power clamp circuit can be automatically turned off.

In a possible implementation, the second power clamp circuit includes: a delay resistor and a delay capacitor that are connected in series, a first MOSFET and a second MOSFET that are connected by using a phase inverter, and a discharging transistor. A first terminal of the delay resistor is electrically connected to the power rail, a second terminal of the delay resistor is electrically connected to a first terminal of the delay capacitor at a first node, and a second terminal of the delay capacitor is electrically connected to the ground rail. A gate of the first MOSFET and a gate of the second MOSFET are both electrically connected at the first node. One of a source or a drain of the first MOSFET is electrically connected to the second-stage discharging circuit at a second node, and the other one of the source or the drain of the first MOSFET is electrically connected to one electrode of the second MOSFET at a third node. The other electrode of the second MOSFET is electrically connected to the ground rail. The first MOSFET and the second MOSFET are two complementary MOSFETs. A gate of the discharging transistor is electrically connected to the third node. One of a source or a drain of the discharging transistor is electrically connected to the second-stage discharging circuit at the second node, and the other one of the source or the drain of the discharging transistor is electrically connected to the ground rail. One of the source or the drain (for example, the source electrode) of the first MOSFET is electrically connected to the power rail $V_{DD}$. When ESD occurs, due to a high voltage of the power rail, a high overdrive voltage may be provided to the second power clamp circuit. As a result, a gate voltage of the discharging transistor becomes high, and a voltage of the second node, that is, a voltage of a node connecting the second-stage discharging circuit and the discharging transistor may be pulled down. In this way, the second-stage discharging circuit can enhance a capability of discharging a current, to improve an ESD protection capability of the ESD protection circuit.

In a possible implementation, the second power clamp circuit includes a first PNP transistor. A collector of the first PNP transistor is electrically connected to the power rail, and an emitter of the first PNP transistor is electrically connected to the ground rail.

In a possible implementation, the second power clamp circuit includes a first Zener diode. A positive electrode of the first Zener diode is electrically connected to the second-stage discharging circuit and the first terminal of the bias resistor, and a negative electrode of the first Zener diode is electrically connected to the ground rail.

In a possible implementation, the ESD protection circuit further includes an inter-stage impedance. The first-stage discharging circuit includes a first pull-up discharging component and a first pull-down discharging component. A first terminal of the first pull-up discharging component is electrically connected to the power rail, and a second terminal of the first pull-up discharging component is electrically connected to the IO pin. A first terminal of the first pull-down discharging component, and a first terminal of the inter-stage impedance, and a second terminal of the first pull-down discharging component is electrically connected to the ground rail. The second-stage discharging circuit includes a second pull-up discharging component and a second pull-down discharging component. A first terminal of the second pull-up discharging component is electrically connected to the second power clamp circuit. A second terminal of the second pull-up discharging component is electrically connected to the protected circuit, a first terminal of the second pull-down discharging component, and a second terminal of the inter-stage impedance. A second terminal of the second pull-down discharging component is electrically connected to the ground rail.

In a possible implementation, the first pull-up discharging component, the first pull-down discharging component, the second pull-up discharging component, and the second pull-down discharging component each include a diode or a silicon controlled rectifier.

In a possible implementation, the first power clamp circuit includes a second Zener diode.

In a possible implementation, the first power clamp circuit includes a second PNP transistor.

In a possible implementation, the first power clamp circuit includes a second RC power clamp circuit.

According to a second aspect, an embodiment of this disclosure provides an apparatus, including a chip and an ESD protection circuit. The ESD protection circuit may be the ESD protection circuit in the first aspect and any one of the possible implementations of the first aspect. The chip includes an IO pin and a protected circuit.

DESCRIPTION OF EMBODIMENTS

The following clearly describes the technical solutions in embodiments of this disclosure with reference to the accompanying drawings in embodiments of this disclosure.

The terms "first", "second", and the like in this disclosure are merely intended for a purpose of description, and shall not be understood as an indication or implication of relative importance or implicit indication of a quantity of indicated technical features. Therefore, a feature limited by "first", "second", or the like may explicitly or implicitly include one or more features. In addition, the term "electrically connected" should be understood in a broad sense. For example, the "electrically connected" may be directly and physically connected, or may be electrically connected by an intermediate medium, for example, connected by a resistor, an inductor, or another electronic component.

Figure 2:
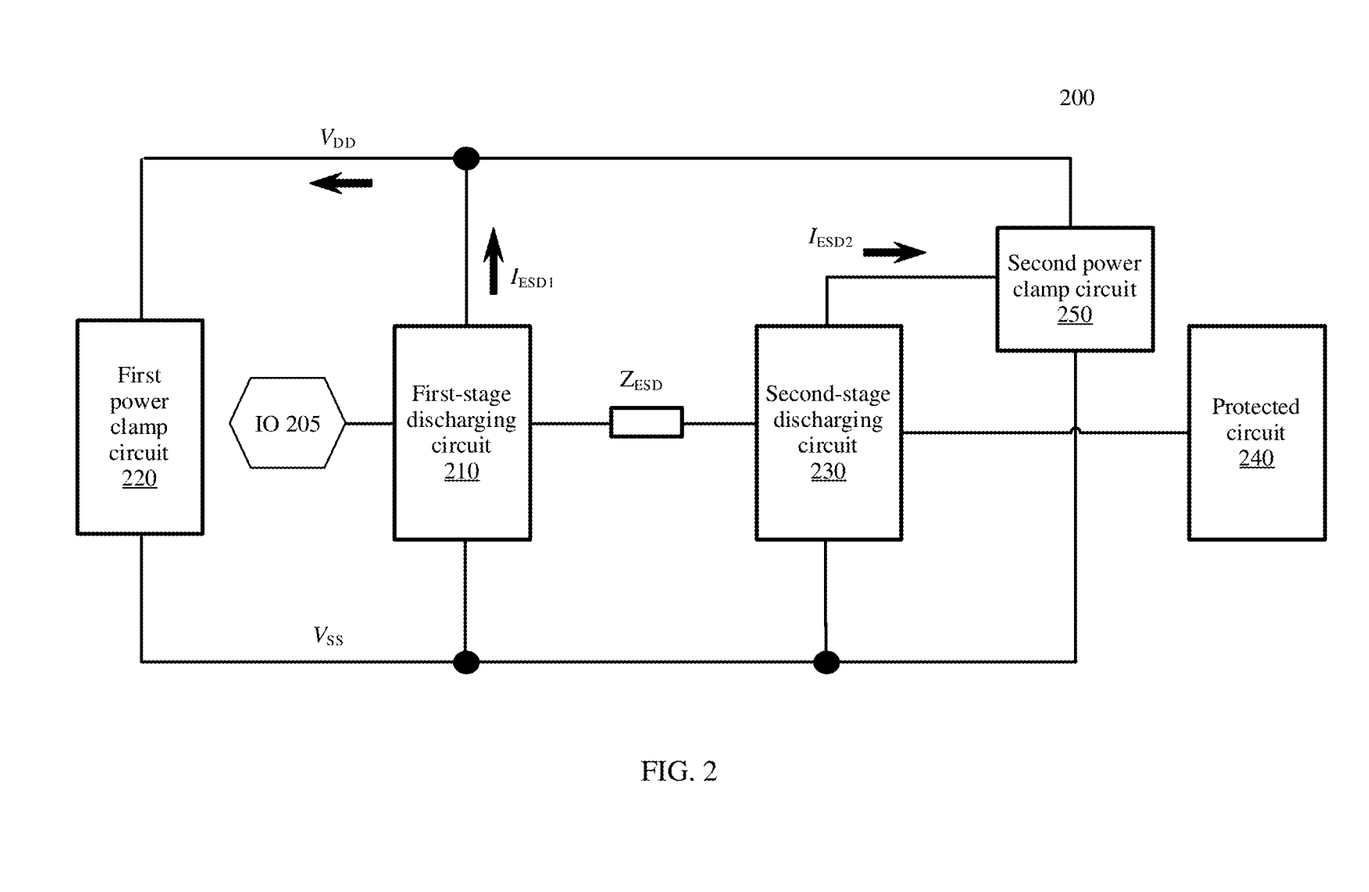
FIG. 2 shows an ESD protection circuit according to an embodiment of this disclosure.

FIG. 2 shows an ESD protection circuit 200 according to an embodiment of this disclosure. The ESD protection circuit 200 is disposed between a power trail $V_{DD}$ and a ground rail $V_{SS}$, and is configured to protect a protected circuit 240. To be specific, the ESD protection circuit 200 is configured to discharge an electrostatic current generated by an IO pin 205 to the ground rail $V_{SS}$. The foregoing protected circuit 240 is also referred to as an internal circuit (internal victim). The power rail $V_{DD}$ may provide a working voltage to the ESD protection circuit 200, and the ground rail $V_{SS}$ may provide a common ground to the ESD protection circuit 200. The ESD protection circuit 200 includes a first-stage discharging circuit 210, a first power clamp circuit 220, a second-stage discharging circuit 230, an inter-stage impedance $Z_{ESD}$, and a second power clamp circuit 250. In the ESD protection circuit 200, the first-stage discharging circuit 210 and the second-stage discharging circuit 230 are coupled by using the inter-stage impedance $Z_{ESD}$.

For example, a first terminal of the first-stage discharging circuit 210 is electrically connected to the IO pin 205 to receive the electrostatic current generated by the IO pin 205. A second terminal of the first-stage discharging circuit 210 is electrically connected to the power rail $V_{DD}$ to output a part of a positive current $I_{ESD1}$ to the power rail $V_{DD}$. A third terminal is electrically connected to the first terminal of the inter-stage impedance $Z_{ESD}$ to output the other part of the positive current $I_{ESD2}$ to the second-stage discharging circuit 230. A fourth terminal is electrically connected to the ground rail $V_{SS}$ to directly discharge a part of a negative current to the ground rail $V_{SS}$. One terminal of the first power clamp circuit 220 is electrically connected to the power rail $V_{DD}$, and the other terminal is electrically connected to the ground rail $V_{SS}$, so as to discharge the positive current $I_{ESD1}$ in the power rail $V_{DD}$ to the ground rail $V_{SS}$. A first terminal of the second-stage discharging circuit 230 is electrically connected to a second terminal of the inter-stage impedance $Z_{ESD}$ to receive the other part of the positive current $I_{ESD2}$. A second terminal of the second-stage discharging circuit 230 is electrically connected to the second power clamp circuit 250 to directly output the positive current $I_{ESD2}$ to the second power clamp circuit 250 without passing through the power rail $V_{DD}$. A third terminal of the second-stage discharging circuit 230 is electrically connected to the protected circuit 240. A fourth terminal of the second-stage discharging circuit 230 is electrically connected to the ground rail $V_{SS}$ to directly discharge the other part of the negative current to the ground rail $V_{SS}$. The second power clamp circuit 250 is electrically connected to the second-stage discharging circuit 230, the power rail $V_{DD}$, and the ground rail $V_{SS}$. A first terminal of the second power clamp circuit 250 receives the other part of the positive current $I_{ESD2}$, a second terminal is electrically connected to the power rail $V_{DD}$, but the other part of the positive current $I_{ESD2}$ is discharged to the ground rail $V_{SS}$ via a third terminal. The other part of the positive current $I_{ESD2}$ does not pass through the power rail $V_{DD}$, and does not share the first power clamp circuit 220 with $I_{ESD1}$. It should be noted that both $I_{ESD1}$ and $I_{ESD2}$ in this embodiment of this disclosure are forward currents.

The current $I_{ESD1}$ generated by the IO pin 205 flows through the power rail $V_{DD}$ via the first-stage discharging circuit 210, and is discharged to the ground rail $V_{SS}$ through the first power clamp circuit 220. In addition, the IO pin also generates a current $I_{ESD2}$ that flows through the second-stage discharging circuit 230 and is discharged to the ground rail $V_{SS}$ through the second power clamp circuit 250.

The second power clamp circuit 250 in the ESD protection circuit 200 may shunt a large current generated by the IO pin. To be specific, one part of the current $I_{ESD1}$ is discharged to the ground rail $V_{SS}$ through the first power clamp circuit 220, and the other part of the current $I_{ESD2}$ is discharged to the ground rail $V_{SS}$ through the second power clamp circuit 250. With introduction of the second power clamp circuit 250, a current up to several amperes may be discharged to the ground rail $V_{SS}$ through two channels. Compared with a shared power rail $V_{DD}$ and a shared power clamp circuit in the conventional technology, the second power clamp circuit 250 shunts an electrostatic current. This can reduce an input node voltage of the protected circuit 240 when ESD occurs, and minimize ESD damage to the protected circuit 240.

In addition, the introduction of the second power clamp circuit 250 does not increase parasitic capacitance between the IO pin 205 and the protected circuit 240. Therefore, the ESD protection circuit 200 can minimize the ESD damage to the protected circuit 240 without affecting a speed of the IO pin 205.

The ESD protection circuit 200 may be used for protection of IO pins of various chips, for example, ESD protection for a high-speed interface, and pin protection for an interface such as a serializer/deserializer (Serdes), a physical layer (PHY), an analog to digital converter (ADC), or a digital to analog converter (DAC).

Specific circuit structures of the first power clamp circuit 220 and the second power clamp circuit 250 are not limited in embodiments of this disclosure. To achieve the foregoing effect, the first power clamp circuit 220 and the second power clamp circuit 250 may use power clamp circuits of a same structure, or may use power clamp circuits of different structures. In an implementation, the power clamp circuit may be an RC power clamp circuit. In another implementation, the power clamp circuit may be a Zener diode or a PNP transistor.

In addition, specific circuit structures of the first-stage discharging circuit 210 and the second-stage discharging circuit 230 are not limited in this embodiment of this disclosure either. For example, in an implementation, the first-stage discharging circuit 210 and the second-stage discharging circuit 230 each may include a plurality of series-connected diodes, so that currents in the first-stage discharging circuit 210 and the second-stage discharging circuit 230 flow unidirectionally. In another implementation, the first-stage discharging circuit 210 and the second-stage discharging circuit 230 each may also include a silicon controlled rectifier (SCR). The inter-stage impedance $Z_{ESD}$ may be a resistor, an inductor, or a capacitor, used for isolation between the first-stage discharging circuit 210 and the second-stage discharging circuit 230.

Figure 3:
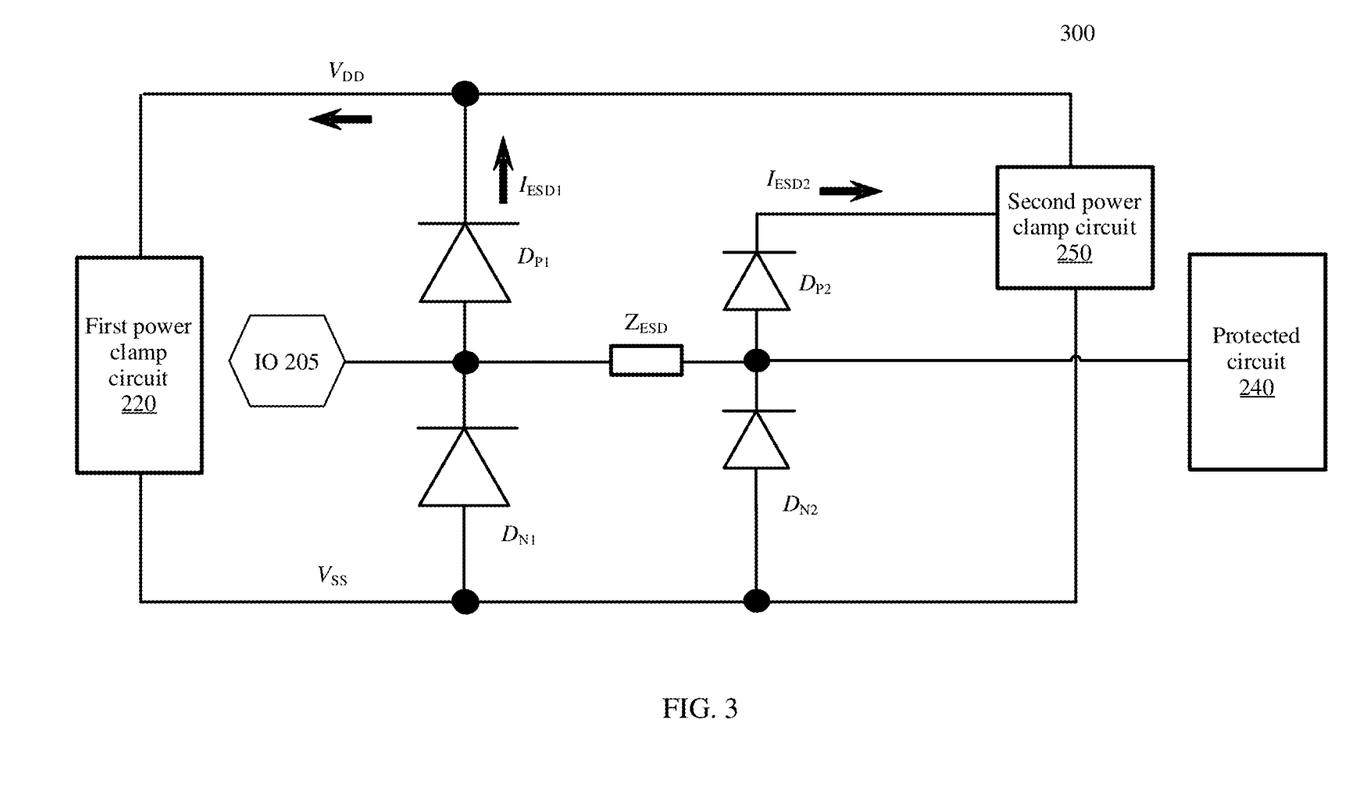
FIG. 3 shows a specific ESD protection circuit according to an embodiment of this disclosure.

FIG. 3 shows a specific ESD protection circuit 300 according to an embodiment of this disclosure. The ESD protection circuit 300 shown in FIG. 3 is described by using an example in which the first-stage discharging circuit 210 and the second-stage discharging circuit 230 are both series-connected diodes. It should be noted that, the first-stage discharging circuit 210 and the second-stage discharging circuit 230 in the ESD protection circuit 300 may alternatively be other types of discharging circuits, for example, the SCR in the foregoing embodiment, or other common discharging circuits. Therefore, specific circuit structures of the first-stage discharging circuit 210 and the second-stage discharging circuit 230 in the ESD protection circuit are not limited in embodiments of this disclosure either.

As shown in FIG. 3, the first-stage discharging circuit 210 in the ESD protection circuit 300 includes a first pull-up discharging component $D_{P1}$ and a first pull-down discharging component $D_{N1}$. A first terminal of the first pull-up discharging component $D_{P1}$ is electrically connected to the power rail $V_{DD}$, and a second terminal of the first pull-up discharging component $D_{P1}$ is electrically connected to the IO pin 205, the first terminal of the first pull-down discharging component $D_{N1}$, and the inter-stage impedance $Z_{ESD}$. A part of a forward electrostatic current $I_{ESD1}$ is input to the first pull-up discharging component $D_{P1}$ through the second terminal of the first pull-up discharging component $D_{P1}$, and is output to the power rail $V_{DD}$ through the first terminal of the first pull-up discharging component $D_{P1}$. The second terminal of the first pull-down discharging component $D_{N1}$ is electrically connected to the ground rail $V_{SS}$, so as to discharge a part of a reverse electrostatic current to the ground rail $V_{SS}$. The second-stage discharging circuit 230 includes a second pull-up discharging component $D_{P2}$ and a second pull-down discharging component $D_{N2}$. A first terminal of the second pull-up discharging component $D_{P2}$ is electrically connected to the second power clamp circuit 250, and a second terminal of the second pull-up discharging component $D_{P2}$ is electrically connected to the inter-stage impedance $Z_{ESD}$, the protected circuit 240, and the first terminal of the first pull-down discharging component $D_{N1}$. The other part of the forward electrostatic current $I_{ESD2}$ is input to the second pull-up discharging component $D_{P2}$ through the second terminal of the second pull-up discharging component $D_{P2}$, and is directly discharged to the power rail $V_{DD}$ by using the second power clamp circuit 250. A second terminal of the second pull-down discharging component $D_{N2}$ is electrically connected to the ground rail $V_{SS}$, to discharge the other part of the reverse electrostatic current to the ground rail $V_{SS}$.

In the ESD protection circuit 300 shown in FIG. 3, the first pull-up discharging component $D_{P1}$, the first pull-down discharging component $D_{N1}$, the second pull-up discharging component $D_{P2}$, and the second pull-down discharging component $D_{N2}$ are all diodes. For example, a positive electrode of a diode serving as the first pull-up discharging component $D_{P1}$ is electrically connected to the IO pin 205, and a negative electrode of the diode is electrically connected to the power rail $V_{DD}$. A positive electrode of a diode serving as the first pull-down discharging component $D_{N1}$ is electrically connected to the ground rail $V_{SS}$, and a negative electrode of the diode is electrically connected to the IO pin 205. A positive electrode of a diode serving as the second pull-up discharging component $D_{P2}$ is electrically connected to the protected circuit 240, and a negative electrode of the diode is electrically connected to the second power clamp circuit 250. A positive electrode of a diode serving as the second pull-down discharging component $D_{N2}$ is electrically connected to the ground rail $V_{SS}$, and a negative electrode of the diode is electrically connected to the protected circuit 240.

In a possible implementation, the second power clamp circuit 250 of the ESD protection circuit 300 is an RC power clamp circuit. A discharging transistor (bigFET) of the RC power clamp circuit may be an NMOS discharging transistor or a PMOS discharging transistor. An external terminal of the resistor of the RC power clamp circuit is electrically connected to the power rail $V_{DD}$, a pull-down terminal of the RC power clamp circuit is electrically connected to the ground rail $V_{SS}$, and a current input terminal of the RC power clamp circuit is electrically connected to the second-stage discharging circuit 230.

Figure 4:
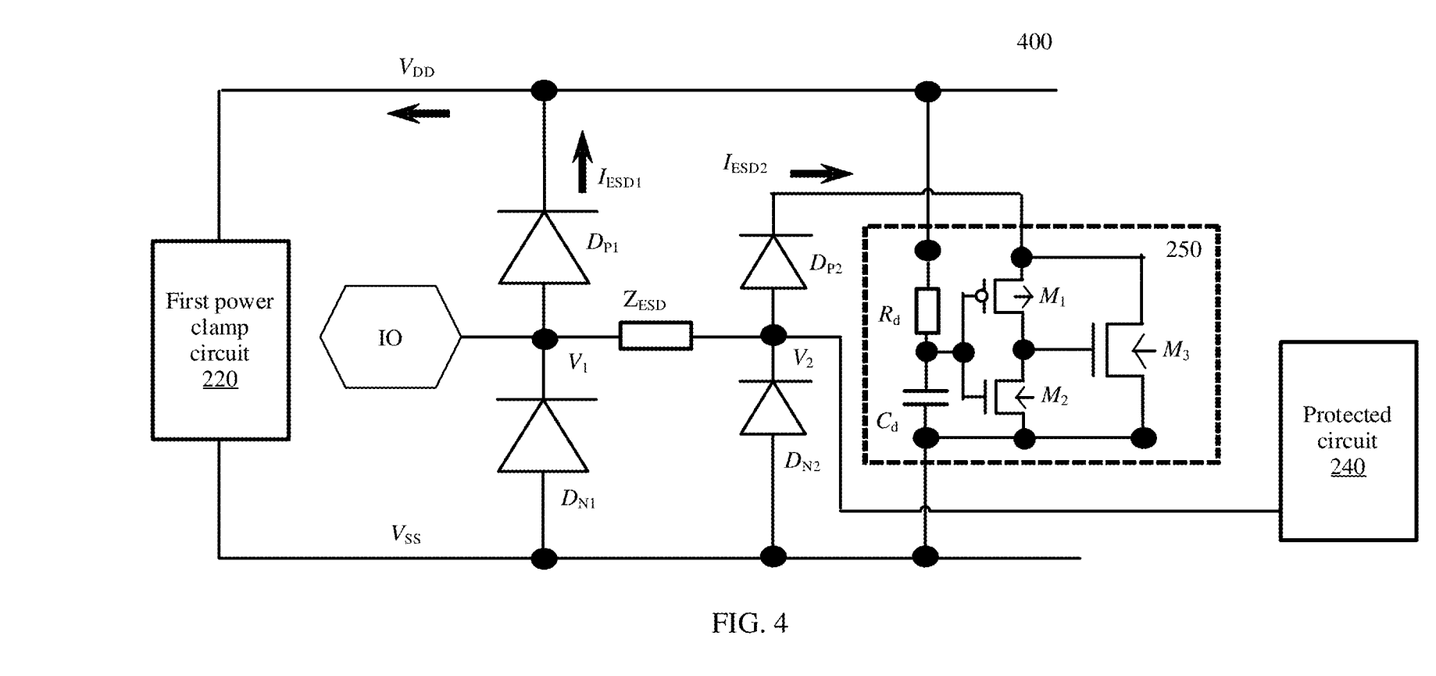
FIG. 4 shows a more specific ESD protection circuit according to an embodiment of this disclosure.

FIG. 4 shows a more specific ESD protection circuit 400 according to an embodiment of this disclosure. The second power clamp circuit 250 is an RC power clamp circuit, and a discharging transistor in the RC power clamp circuit is an NMOS discharging transistor. The ESD protection circuit 400 is described by using an example in which the first-stage discharging circuit 210 and the second-stage discharging circuit 230 both include series-connected diodes. However, specific circuit structures of the first-stage discharging circuit 210 and the second-stage discharging circuit 230 are not limited in this disclosure. The second power clamp circuit 250 includes a delay resistor $R_d$, a delay capacitor $C_d$, a first MOSFET $M_1$, a second MOSFET $M_2$, and a discharging transistor $M_3$. The delay resistor $R_d$ and the delay capacitor $C_d$ are connected in series. A first terminal of the delay resistor $R_d$ (that is, the external terminal of the resistor) is electrically connected to the power rail $V_{DD}$. A second terminal of the delay resistor $R_d$ and a first terminal of the delay capacitor $C_d$ are electrically connected at a first node. A second terminal of the delay capacitor $C_d$ is electrically connected to the ground rail $V_{SS}$. The first MOSFET $M_1$ and the second MOSFET $M_2$ are connected by using a phase inverter. To be specific, a gate of the first MOSFET $M_1$ and a gate of the second MOSFET $M_2$ are electrically connected at the first node. One of a source or a drain (for example, the source) of the first MOSFET $M_1$ is electrically connected to the second-stage discharging circuit 230 at a second node, to receive a current $I_{ESD2}$. The other one of the source or the drain (for example, the drain) of the first MOSFET $M_1$ is electrically connected to one electrode (for example, a drain) of the second MOSFET $M_2$ at a third node. The other electrode (for example, a source) of the second MOSFET $M_2$ is electrically connected to the ground rail $V_{SS}$. A gate of the discharging transistor $M_3$ is electrically connected to the third node. One of a source or a drain (for example, a source) of the discharging transistor $M_3$ is electrically connected to the second-stage discharging circuit 230 at the second node, and the other one of the source or the drain (for example, a drain) of the discharging transistor $M_3$ is electrically connected to the ground rail $V_{SS}$. The current $I_{ESD2}$ flows from the second-stage discharging circuit 230 to the current input terminal of the second power clamp circuit 250, that is, the second node, and then is discharged to the ground rail $V_{SS}$ through the discharging transistor $M_3$.

Because the current $I_{ESD2}$ is less than a current $I_{ESD1}$, in an implementation, a size of the MOSFET in the second power clamp circuit 250 may be less than a size of the MOSFET in the first power clamp circuit 220. For example, the size of the MOSFET in the second power clamp circuit 250 may be ⅕ to 1/10 of the size of the MOSFET in the first power clamp circuit 220. Therefore, the second power clamp circuit 250 with a smaller MOSFET may be used to increase an electrostatic protection capability of the ESD protection circuit 400 at the cost of a smaller area.

Figure 5:
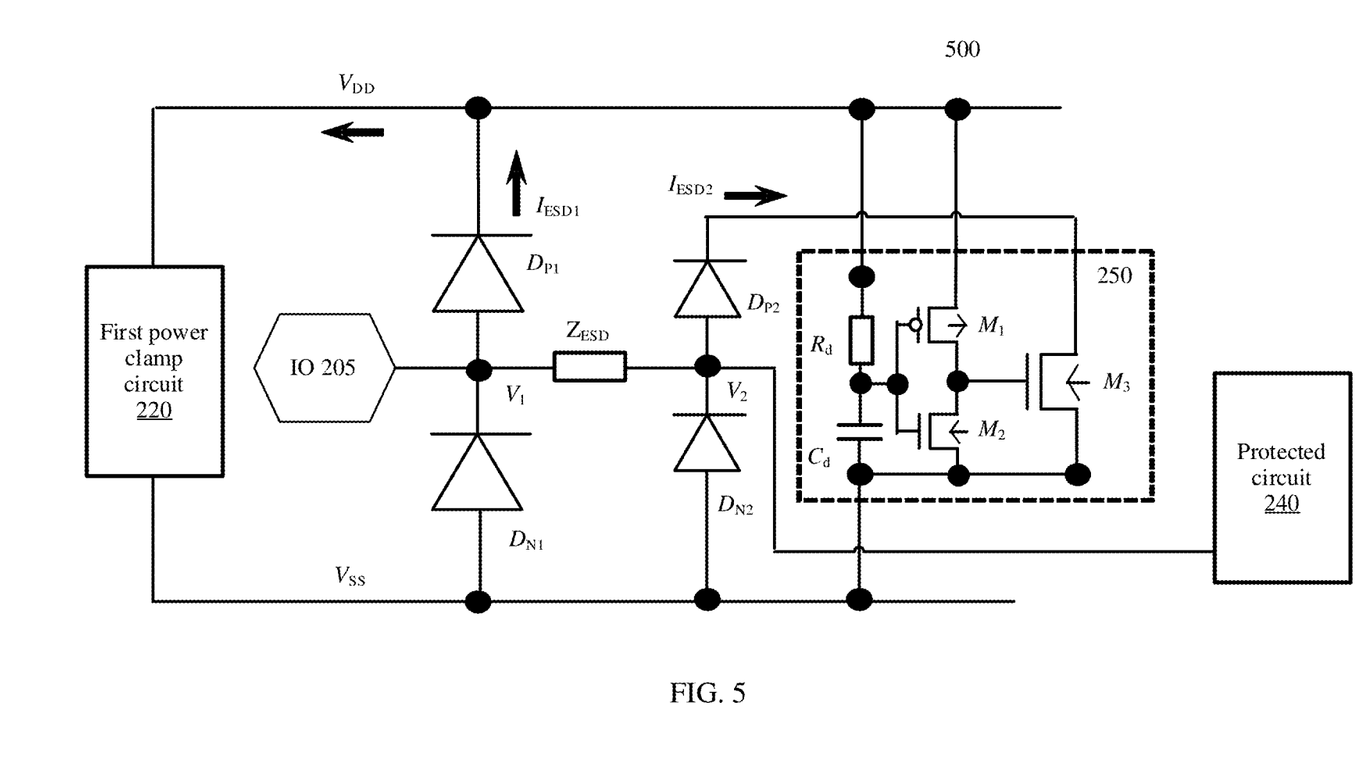
FIG. 5 shows another more specific ESD protection circuit according to an embodiment of this disclosure.

FIG. 5 shows another more specific ESD protection circuit 500 according to an embodiment of this disclosure. The ESD protection circuit 500 is similar to the ESD protection circuit 400, and a similarity is not described again. A difference lies in that, one of a source or a drain (for example, the source) of a first MOSFET $M_1$ in the ESD protection circuit 500 is electrically connected to the power rail $V_{DD}$ instead of the second-stage discharging circuit 230 and a drain or a source of the discharging transistor $M_3$. In addition, the drain or source (for example, the source) of the discharging transistor $M_3$ is electrically connected to the second-stage discharging circuit 230.

One of the source or the drain (for example, the source electrode) of the first MOSFET $M_1$ is electrically connected to the power rail $V_{DD}$. When ESD occurs, due to a high voltage of the power rail $V_{DD}$, a high overdrive voltage may be provided to the second power clamp circuit 250. As a result, a gate voltage of the discharging transistor $M_3$ becomes high, and a voltage of the second node, that is, a voltage of a node connecting the second-stage discharging circuit 230 and the discharging transistor $M_3$ can be pulled down. In this way, the second-stage discharging circuit 230 can enhance a capability of discharging a current $I_{ESD2}$, to improve an ESD protection capability of the ESD protection circuit 500.

Figure 6A:
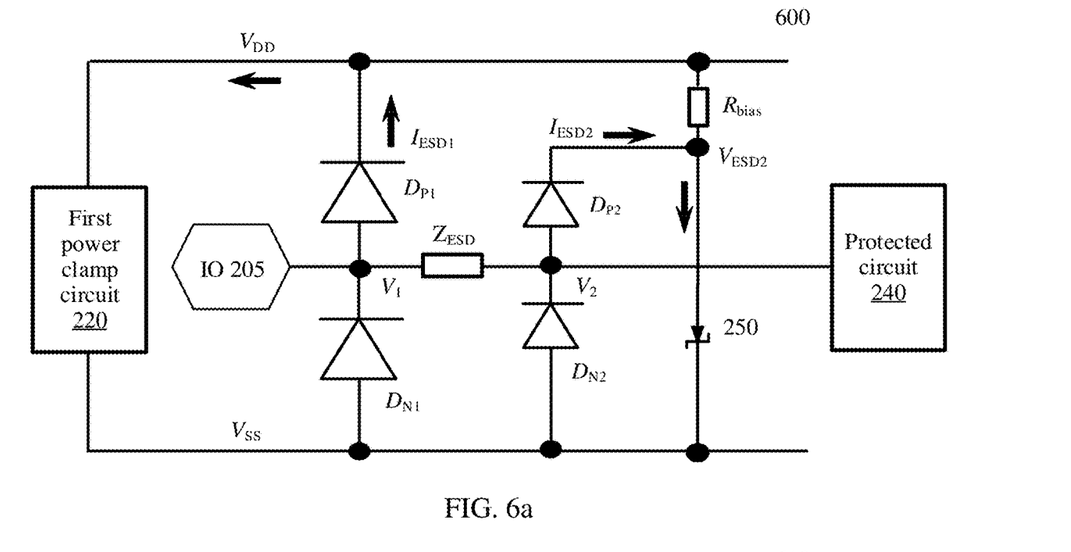
FIG. 6a shows an ESD protection circuit including a bias resistor according to an embodiment of this disclosure.
Figure 6B:
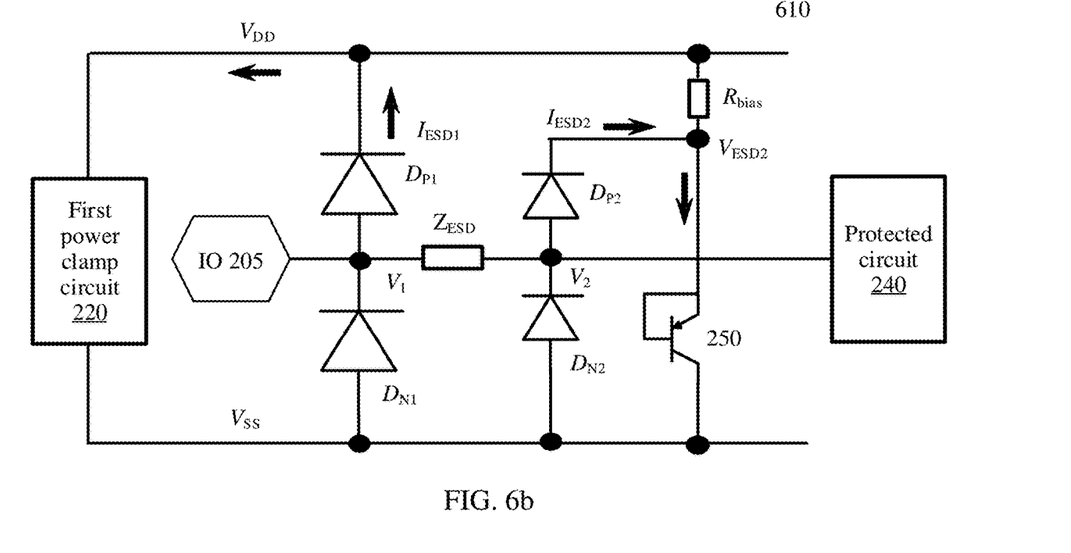
FIG. 6b shows another ESD protection circuit including a bias resistor according to an embodiment of this disclosure.

An embodiment of this disclosure further provides an ESD protection circuit 600 shown in FIG. 6a and an ESD protection circuit 610 shown in FIG. 6b. The ESD protection circuit 600 and the ESD protection circuit 610 each include a bias resistor $R_{bias}$. A first terminal of the bias resistor $R_{bias}$ is electrically connected to a current input terminal of the second power clamp circuit 250 and the second-stage discharging circuit 230. A second terminal of the bias resistor $R_{bias}$ is electrically connected to the power rail $V_{DD}$. A pull-down terminal of the second power clamp circuit 250 is electrically connected to the ground rail $V_{SS}$. The bias resistor $R_{bias}$ is configured to isolate the second-stage discharging circuit 230 from the power rail $V_{DD}$, so that the second-stage discharging circuit 230 does not share the first power clamp circuit 220 with the first-stage discharging circuit 210 through the power rail $V_{DD}$. In this way, a current $I_{ESD2}$ can be discharged to the ground rail $V_{SS}$ through the second-stage discharging circuit 230. In one implementation, for some ESD scenarios, such as a current of 5 A in a CDM, the foregoing bias resistor $R_{bias}$>200Ω better isolates the second-stage discharging circuit 230 from the power rail $V_{DD}$. When a chip is powered on and operates normally, the bias resistor $R_{bias}$ provides a bias voltage, to turn off the second power clamp circuit 250.

Because the current $I_{ESD2}$ is less than a current $I_{ESD1}$, in an implementation, a size of the MOSFET in the second power clamp circuit 250 may be less than a size of the MOSFET in the first power clamp circuit 220. For example, the size of the MOSFET in the second power clamp circuit 250 may be ⅕ to ⅒ of the size of the MOSFET in the first power clamp circuit 220. Therefore, the second power clamp circuit 250 with a smaller MOSFET may be used to increase an electrostatic protection capability of the ESD protection circuit 400 at the cost of a smaller area.

FIG. 6a shows another more specific ESD protection circuit 600 according to an embodiment of this disclosure. The ESD protection circuit 600 is similar to an ESD protection circuit 300, and a similarity is not described again. A difference lies in that, the ESD protection circuit 600 further includes the bias resistor $R_{bias}$. The first terminal of the bias resistor $R_{bias}$ is electrically connected to the current input terminal of the second power clamp circuit 250 and the second-stage discharging circuit 230. The second terminal of the bias resistor $R_{bias}$ is electrically connected to the power rail $V_{DD}$. The pull-down terminal of the second power clamp circuit 250 is electrically connected to the ground rail $V_{SS}$. In addition, the second power clamp circuit 250 includes a Zener diode 250. For example, a positive electrode of the Zener diode 250 is electrically connected to a second pull-up discharging component $D_{P2}$ of the second-stage discharging circuit 230 and the first terminal of the bias resistor $R_{bias}$. A negative electrode of the Zener diode 250 is electrically connected to the ground rail $V_{SS}$.

FIG. 6b shows another more specific ESD protection circuit 610 according to an embodiment of this disclosure. The ESD protection circuit 610 is similar to an ESD protection circuit 600, and a similarity is not described again. A difference lies in that the second power clamp circuit 250 includes a PNP transistor. A collector of the PNP transistor is electrically connected to both the current input terminal of the second power clamp circuit 250 and the first terminal of the bias resistor $R_{bias}$, and an emitter of the PNP transistor is electrically connected to the ground rail $V_{SS}$.

It is easy to understand that FIG. 6a and FIG. 6b show only two examples of the second power clamp circuit 250. The second power clamp circuit 250 may alternatively be of another circuit structure. The circuit structure of the second power clamp circuit 250 is not limited in this disclosure.

Figure 7A:
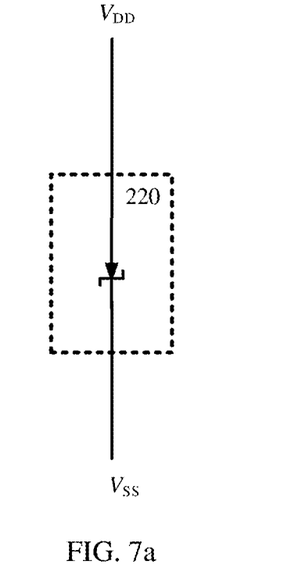
FIG. 7a shows a first power clamp circuit according to an embodiment of this disclosure.
Figure 7B:
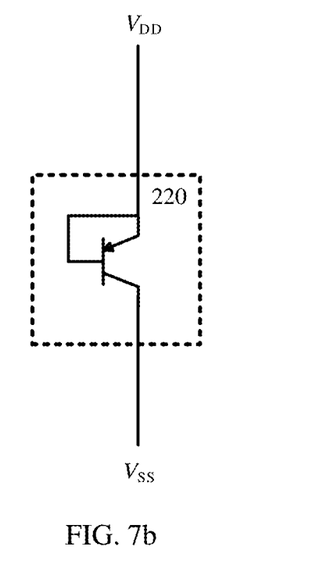
FIG. 7b shows another first power clamp circuit according to an embodiment of this disclosure.
Figure 7C:
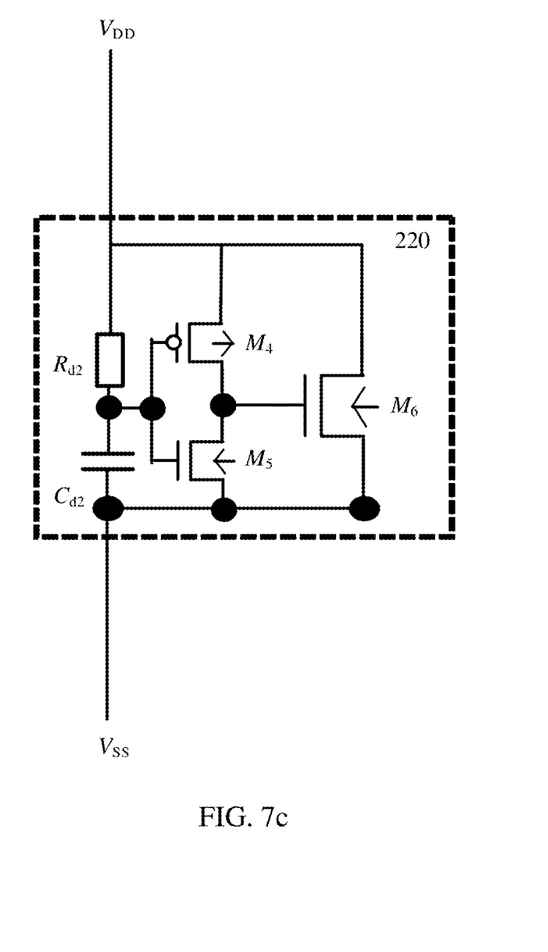
FIG. 7c shows still another first power clamp circuit according to an embodiment of this disclosure.

Similarly, a circuit structure of the first power clamp circuit 220 is not limited in this embodiment of this disclosure. In a possible implementation, the first power clamp circuit 220 may be a Zener diode shown in FIG. 7a. A positive electrode of the Zener diode and the negative electrode of the power rail $V_{DD}$, are electrically connected to the ground rail $V_{SS}$. In a possible implementation, the first power clamp circuit 220 may be a PNP transistor shown in FIG. 7b. A collector of the PNP transistor is electrically connected to the power rail $V_{DD}$, and an emitter of the PNP transistor is electrically connected to the ground rail $V_{SS}$. In another implementation, the first power clamp circuit 220 may be an RC power clamp circuit, for example, an RC power clamp circuit whose discharging transistor is a PMOS, or an RC power clamp circuit whose discharging transistor is an NMOS shown in FIG. 7c. A circuit structure of the NMOS-based RC power clamp circuit shown in FIG. 7c is the same as that of the second power clamp circuit 250 in FIG. 4. A delay resistor $R_{d2}$, a fourth MOSFET $M_4$, and a connecting terminal of a discharging transistor $M_6$ are electrically connected to the power rail $V_{DD}$. A delay capacitor $C_{d2}$, a fifth MOSFET $M_5$, and a connecting terminal of the discharging transistor $M_6$ are electrically connected to the ground rail $V_{SS}$.

An embodiment of this disclosure further provides an apparatus, including a chip and an ESD protection circuit. The ESD protection circuit may be the ESD protection circuit in any embodiment of this disclosure. The chip includes an IO pin and a protected circuit. For example, both the chip and the ESD protection circuit may be disposed on a printed circuit board (PCB), and are electrically connected through other electronic components or signal lines.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:
1. An electrostatic discharge (ESD) protection circuit, wherein the ESD protection circuit comprises:
a first-stage discharging circuit that is electrically connected to an IO pin, a power rail, and a ground rail;
a first power clamp circuit that is electrically connected to the power rail and the ground rail;

a second-stage discharging circuit that is electrically connected to a protected circuit, and the ground rail; and a second power clamp circuit that is electrically connected to the second-stage discharging circuit and the ground rail, wherein the ESD protection circuit further comprises a bias resistor, a current input terminal of the second power clamp circuit is electrically connected to the second-stage discharging circuit and a first terminal of the bias resistor, a pull-down terminal of the second power clamp circuit is electrically connected to the ground rail, and a second terminal of the bias resistor is electrically connected to the power rail.

2. The ESD protection circuit according to claim 1, wherein the second power clamp circuit comprises a first PNP transistor, a collector of the first PNP transistor is electrically connected to the second-stage discharging circuit and the first terminal of the bias resistor, and an emitter of the first PNP transistor is electrically connected to the ground rail.

3. The ESD protection circuit according to claim 1, wherein the second power clamp circuit comprises a first Zener diode, a positive electrode of the first Zener diode is electrically connected to the second-stage discharging circuit and the first terminal of the bias resistor, and a negative electrode of the first Zener diode is electrically connected to the ground rail.

4. The ESD protection circuit according to claim 1, wherein the ESD protection circuit further comprises an inter-stage impedance, the first-stage discharging circuit comprises a first pull-up discharging component and a first pull-down discharging component, wherein a first terminal of the first pull-up discharging component is electrically connected to the power rail, a second terminal of the first pull-up discharging component is electrically connected to the IO pin, a first terminal of the first pull-down discharging component, and a first terminal of the inter-stage impedance, and a second terminal of the first pull-down discharging component is electrically connected to the ground rail, and the second-stage discharging circuit comprises a second pull-up discharging component and a second pull-down discharging component, wherein a first terminal of the second pull-up discharging component is electrically connected to the second power clamp circuit, a second terminal of the second pull-up discharging component is electrically connected to the protected circuit, a first terminal of the second pull-down discharging component, and a second terminal of the inter-stage impedance, and a second terminal of the second pull-down discharging component is electrically connected to the ground rail.

5. The ESD protection circuit according to claim 4, wherein the first pull-up discharging component, the first pull-down discharging component, the second pull-up discharging component, and the second pull-down discharging component each comprise a diode or a silicon controlled rectifier.

6. The ESD protection circuit according to claim 1, wherein the first power clamp circuit comprises a second Zener diode.

7. The ESD protection circuit according to claim 1, wherein the first power clamp circuit comprises a second PNP transistor.

8. The ESD protection circuit according to claim 1, wherein the first power clamp circuit comprises a second RC power clamp circuit.

9. An apparatus, comprising a chip and an electrostatic discharge (ESD) protection circuit, wherein the chip comprises an IO pin and a protected circuit, and the ESD protection circuit comprises:

a first-stage discharging circuit that is electrically connected to the IO pin, a power rail, and a ground rail;

a first power clamp circuit that is electrically connected to the power rail and the ground rail;

a second-stage discharging circuit that is electrically connected to the protected circuit, and the ground rail; and a second power clamp circuit that is electrically connected to the second-stage discharging circuit and the ground rail, the ESD protection circuit further comprises a bias resistor, a current input terminal of the second power clamp circuit is electrically connected to the second-stage discharging circuit and a first terminal of the bias resistor, a pull-down terminal of the second power clamp circuit is electrically connected to the ground rail, and a second terminal of the bias resistor is electrically connected to the power rail.

10. The apparatus according to claim 9, wherein the second power clamp circuit comprises a first PNP transistor, a collector of the first PNP transistor is electrically connected to the second-stage discharging circuit and the first terminal of the bias resistor, and an emitter of the first PNP transistor is electrically connected to the ground rail.

11. The apparatus according to claim 9, wherein the second power clamp circuit comprises a first Zener diode, a positive electrode of the first Zener diode is electrically connected to the second-stage discharging circuit and the first terminal of the bias resistor, and a negative electrode of the first Zener diode is electrically connected to the ground rail.

12. The apparatus according to claim 9, wherein the ESD protection circuit further comprises an inter-stage impedance, the first-stage discharging circuit comprises a first pull-up discharging component and a first pull-down discharging component, wherein a first terminal of the first pull-up discharging component is electrically connected to the power rail, a second terminal of the first pull-up discharging component is electrically connected to the IO pin, a first terminal of the first pull-down discharging component, and a first terminal of the inter-stage impedance, and a second terminal of the first pull-down discharging component is electrically connected to the ground rail, and the second-stage discharging circuit comprises a second pull-up discharging component and a second pull-down discharging component, wherein a first terminal of the second pull-up discharging component is electrically connected to the second power clamp circuit, a second terminal of the second pull-up discharging component is electrically connected to the protected circuit, a first terminal of the second pull-down discharging component, and a second terminal of the inter-stage impedance, and a second terminal of the second pull-down discharging component is electrically connected to the ground rail.

13. The apparatus according to claim 12, wherein the first pull-up discharging component, the first pull-down discharging component, the second pull-up discharging component, and the second pull-down discharging component each comprise a diode or a silicon controlled rectifier.

14. The apparatus according to claim 9, wherein the first power clamp circuit comprises:
a second Zener diode,
a second PNP transistor, or
a second RC power clamp circuit.

* * * * *